United States Patent [19]
Babinski et al.

[11] 4,211,505
[45] Jul. 8, 1980

[54] FLUIDIC TRANSPORT INTERSECTION

[75] Inventors: John P. Babinski, Essex Junction; Bruce I. Bertelsen, Essex; Karl H. Raacke, Essex Junction; Valdeko H. Sirgo, Colchester, all of Vt.

[73] Assignee: International Business Machines Corporation, Armonk, N.Y.

[21] Appl. No.: 753,672

[22] Filed: Dec. 23, 1976

Related U.S. Application Data

[63] Continuation-in-part of Ser. No. 618,655, Oct. 1, 1975, abandoned.

[51] Int. Cl.² ............................................. B65G 51/02
[52] U.S. Cl. ........................................ 406/19; 406/84; 406/87
[58] Field of Search .......................... 302/2 R, 29, 31; 214/1 BE; 414/676, 755; 198/380; 406/87, 84, 19

[56] References Cited
U.S. PATENT DOCUMENTS 3,976,329  8/1976  Adams et al. ..................... 302/2 R
3,976,330  8/1976  Babinski et al. .................. 302/2 R

OTHER PUBLICATIONS

IBM Technical Disclosure Bulletin; vol. 18, No. 6; by Gruber et al.; pp. 1865–1866; Nov. 1975.
IBM Technical Disclosure Bulletin; vol. 17, No. 8; by Kehagioglou et al.; pp. 2319–2320; Jan. 1975.
IBM Technical Disclosure Bulletin; vol. 17, No. 8; by Noteware et al.; p. 2340; Jan. 1975.
IBM Technical Disclosure Bulletin; vol. 16, No. 2; by Babinski; pp. 469–470; Jul. 1973.

Primary Examiner—Jeffrey V. Nase
Attorney, Agent, or Firm—Stephen J. Limanek

[57] ABSTRACT

The invention taught is an apparatus and method for providing automatic or semiautomatic interconnections and intersections in a fluidic transportation system. In particular the teaching relates to the transportation of semiconductor wafers or slices between processing stations on a dual highway type system utilizing a fluidic cushion means whereby said wafers can be processed in a random manner and transported under a controlled environment dissimilar to the processing environment. However, the track and system may be constructed into a multiplicity of configurations and is not limited to a dual or single track system.

9 Claims, 7 Drawing Figures

FLUIDIC TRANSPORT INTERSECTION

This is a Continuation-In-Part of Application Ser. No. 618,655, filed Oct. 1, 1975, now abandoned.

BACKGROUND OF THE INVENTION

1. Field of the Invention

This invention pertains to a semiconductor wafer minimum volume fluidic cushion transport system intersection and traffic control means wherein modular units are assembled to form a system taught in commonly assigned Application Ser. No. 618,654, filed on Oct. 1, 1975, now U.S. Pat. No. 3,976,330, whereby semiconductor substrates are transported in any desirable configuration to and from processing stations under a controlled environment dissimilar to the various processing environments. Said environment includes atmosphere, temperature, wave lengths of light and electronics. In a more specific sense the invention relates to management of directional traffic flow by providing a means for intersectional direction means and control, as well as providing a means for interconnecting with other systems or adjacent buffer or holding stations as the case may be.

2. Description of the Prior Art

It is known to fabricate and assemble a manufacturing system utilizing a plurality of satellite functional processing stations or sectors each capable of stand alone operation as well as with stations interconnected, e.g., as taught in U.S. Pat. No. 3,889,355 by Aronstein et al. It is also known to transport a work piece on a cushion of air and if a new direction is desired, the work piece is stopped and the direction of air or gaseous medium flow is changed, as taught in U.S. Pat. No. 2,678,237 by Allander et al. R. G. Hagler in U.S. Pat. No. 3,717,381, discloses a gaseous cushion transport system and positioning system utilizing compressed air and vacuum ports for transporting and positioning. The teaching illustrated in the aforesaid disclosures are utilizing open systems without environmental control and are not disclosing a self-centering arrangement or redirectional control as taught by the instant specification.

SUMMARY OF THE INVENTION

It is the object of this invention to provide in an environmentally controlled and enclosed minimum volume fluidic transport system capable of transporting semiconductor wafers in a random configuration, a means for automatically or manually directing work pieces such as semiconductor wafers in any desired 90° turn. Other angles are also possible, but not normal.

It is still another object of this invention to provide a means for stopping, centering, and redirecting a work piece in any preprogrammed desired direction within a controlled environmental enclosed system minimum volume fluidic transport system.

A still further object of this invention is to provide an intersection in a dual highway fluidic transport system whereby semiconductor wafers are transported to and from processing stations in a random or any other desired configuration.

These and other objects are accomplished by providing a self-centering vectorized modular fluidic transport section capable of stopping the work piece and centering the same and redirecting same in any 90° direction by providing any combination of sections to form such configurations as a dual bidirectional travel pattern embodying turn around sections, directional intersections, holding buffer sections and the like. The said system being enclosed in a positive pressurized atmosphere or environment. The invention will be more fully understood and appreciated by the explanation of the ensuing description of the preferred and specific embodiment thereof in connection with the drawings.

DESCRIPTION OF A PREFERRED EMBODIMENT

Figure 1:
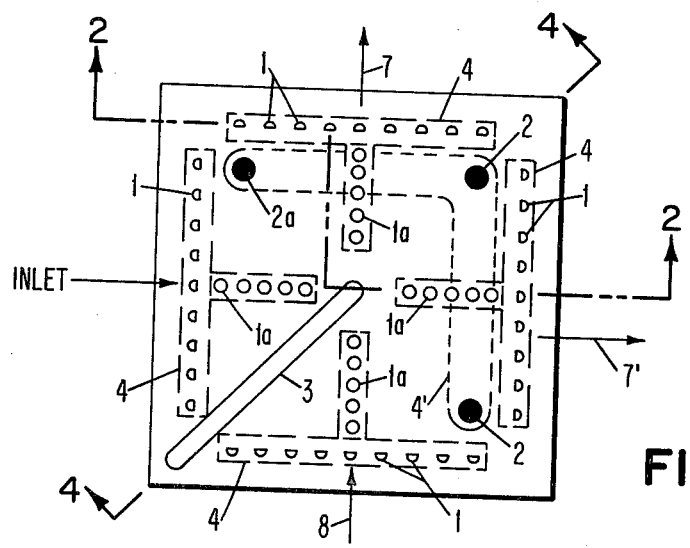
FIG. 1 is a top plan view of a single section illustrating the vectorized fluidic jet means, the vacuum stop and centering configuration as well as the optical sensing means.
Figure 2:
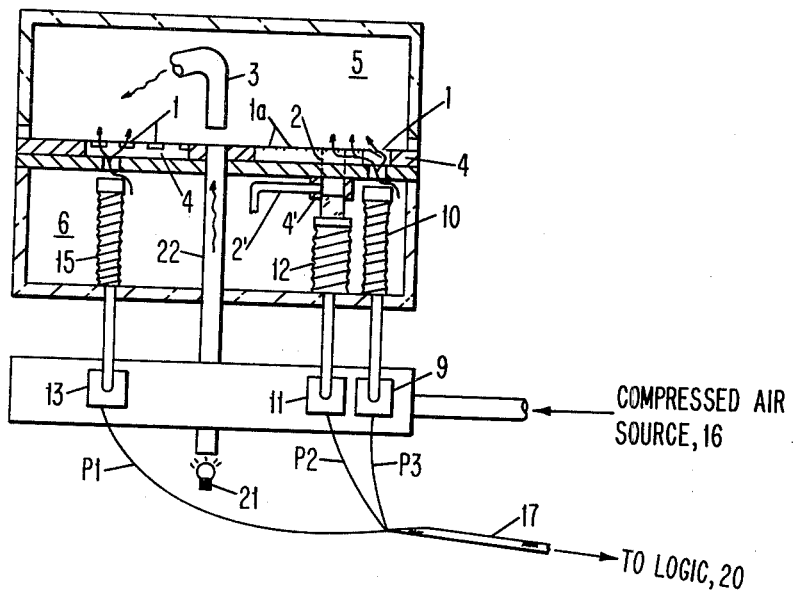
FIG. 2 is a section of FIG. 1 through 2—2 showing the lower plenum and a manifold section between said lower plenum and the transport membrane forming the floor of the upper plenum, and illustrating a means for terminating air flow and vacuum action as preprogrammed or directed and controlled by illustrated compressed air solenoid valves.

Referring now to the drawings, FIG. 1 illustrates a single modular fluidic section showing a vectorized fluid, for example, air means having ports 1 as part of an enclosed vectorized fluidic transport system having upper and lower major plenums 5 and 6, indicated in FIG. 2 of the drawing, wherein work pieces are transported to and from processing stations in a random preprogrammed manner. In a system of this nature there must be provided means for directing the work piece, and in this particular embodiment, semiconductor silicon wafers are transported for processing at processing stations wherein various treatments and reactions are undertaken. Such means as intersections, turn around means in a dual lane system, as well as means for diverting and holding wafers prior to and subsequent to processing and various other combinations of a directional section shown in FIG. 1 are necessary and an integral part of a fluidic transport system.

Figure 3:
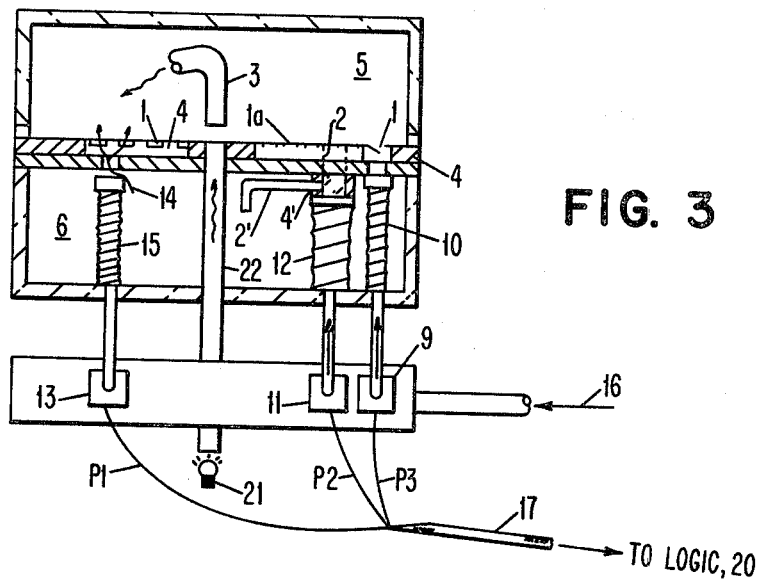
FIG. 3 is a similar section as FIG. 2 illustrating the operating of a bellows to terminate the vacuum and fluidic forces.

FIG. 1 also illustrates vacuum stop means 2 and 2a associated with a manifold 4' and a light pipe 3 which is associated with an optical sensing means. As a wafer enters said section from the direction of the inlet arrow it is decelerated by vacuum stop 2a and rotated counter-clockwise and is finally stopped in a substantially centered position in the section as well as its presence being detected by the sensing means including light pipe 3 whereupon the vacuum is terminated by activating the solenoid valve 11, as indicated in FIGS. 2 and 3 which by the use of compressed air extends the bellows 12 to terminate vacuum pull from conduit 2', coupled to a vacuum source, not shown, on all vacuum stops in the section and the work piece is centered by the gaseous fluid flowing from the ports 1 from each side. Ports 1a direct the gaseous fluid vertically to support the work piece above these ports 1a. The ports 1 or jets of semicircular openings formed in the floor membrane are disposed over an underlying groove forming a manifold 4 between the upper plenum 5 and the lower plenum 6 both of which are illustrated in FIG. 2. The wafer can travel in one of two directions in this section configuration as indicated by the outlet arrows 7 and 7'. If the entrance is from the direction of arrow 8, the wafer can travel straight through following arrow 7 or in the direction of arrow 7'. It can be seen that the direction of travel options is dependent upon the point entrance.

The direction of travel is made possible by stopping the flow of air at the desired exit direction. This is accomplished in a preprogrammed manner by activating a solenoid valve 9 using compressed air or other means which expands bellows 10 or any other suitable means to terminate fluid flow at the exit portion of the section. This is accomplished in a preprogrammed manner by activating the solenoid controlling the exit bank of jets as illustrated in FIG. 3 where vacuum bellows 12 is shown in a closed position terminating vacuum from conduit 2' and fluidic air flow stopped by bellows 10 being closed, while the fluidic medium 14 continues to flow through the opening which is controlled by the solenoid air valve 13 and bellows 15.

The solenoid valves in this case, or other suitable means, are operated by a compressed air source 16.

Figure 4:
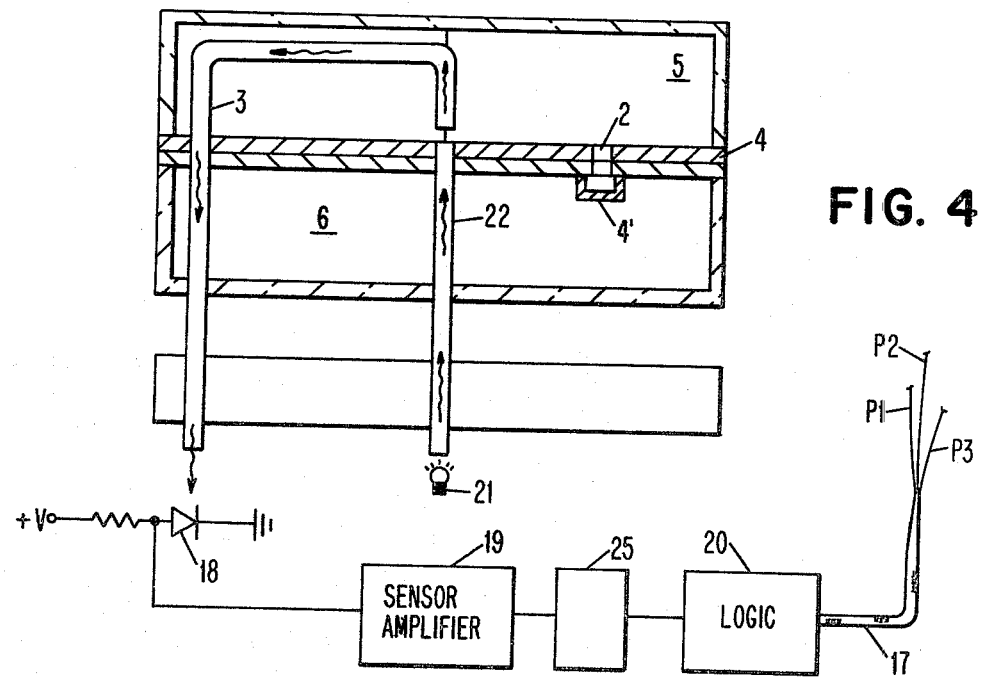
FIG. 4 is a section through 4—4 of FIG. 1 illustrative of the optical detection system and the associated electronics for control of the vacuum and fluidic medium, e.g., air.

Each valve has a coupling from a light sensitive diode 18, as shown in FIG. 4, by means of cables P1, P2, and P3, which form the logic cable 17, a sensor-amplifier 19, a Schmitt trigger 25 and a logic system 20 enabling preprogrammed action. This arrangement is illustrated in both FIGS. 4 and 5 wherein a light source 21 directs light through light pipes 22 and 3 to diode 18. The light sensitive diode 18 detects the variation in light when a work piece breaks the light flow and causes vacuum to terminate in the section after the work piece comes to rest on all vacuum stops. In turn centering takes place by the air jets directing air onto the work piece from all sides. Vacuum supply is maintained at all times and terminated only after a work piece is detected and substantially centered within the section.

Figure 5:
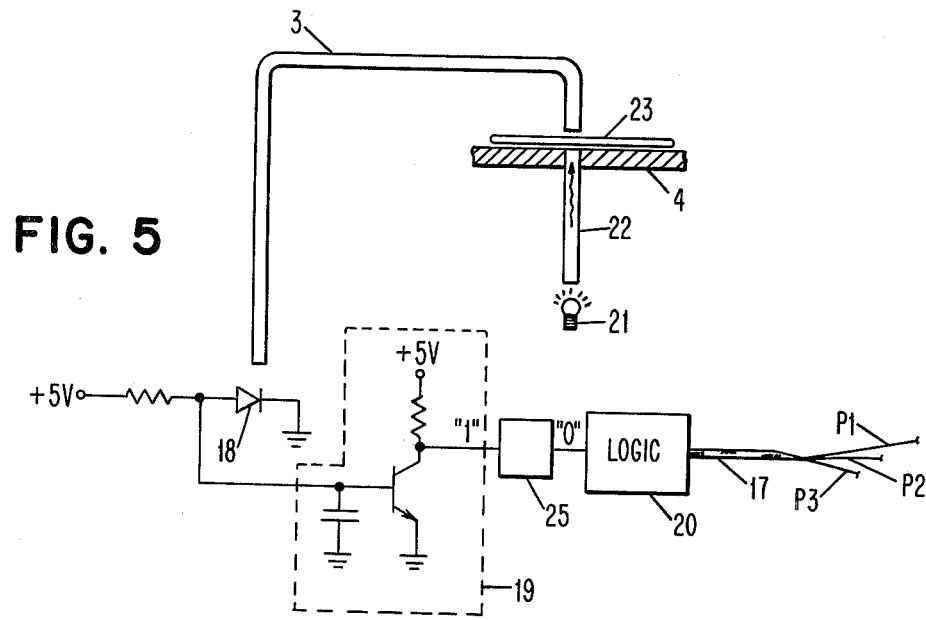
FIG. 5 is a schematic illustration of the electronic control system in conjunction with an optical sensing means.

In FIG. 5, one can see the light from the light source 21 being interrupted by a semiconductor wafer 23 and the sensing circuit including the sensor amplifier 19 and the Schmidt trigger 25 activates the logic system 20.

Figure 6:
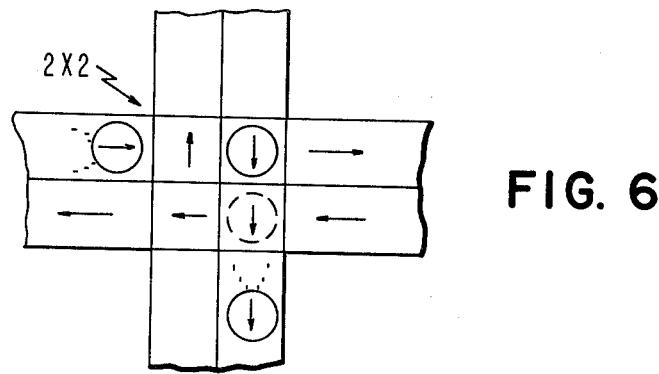
FIG. 6 is a schematic illustration of dual highway intersection utilizing four separate modular sections commonly referred to as a 2×2 arrangement.
Figure 7:
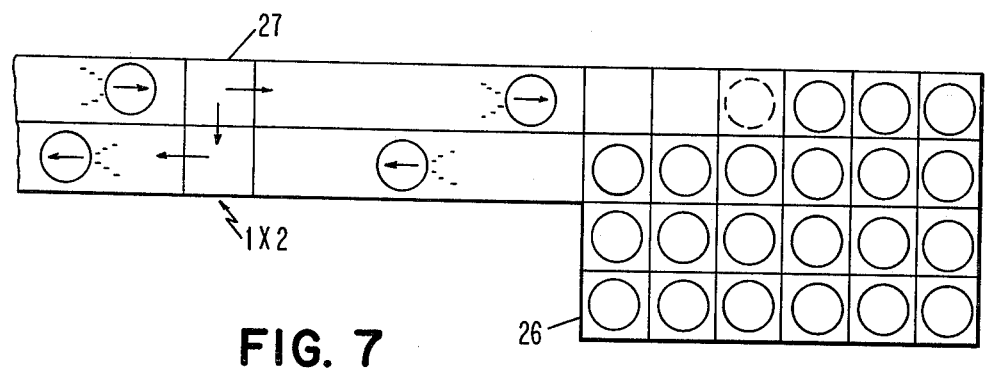
FIG. 7 is a similar schematic illustration of a 1×2 configuration utilizing as a turn around means in conjunction with a storage or holding buffer.

FIG. 6 shows the aforesaid section in a dual highway type system whereby directional options are illustrated by the various arrows. This arrangement is referred to as a 2×2 intersection. In FIG. 7, another variation 27 or a 1×2 arrangement is shown at the entrance to a storage buffer holding section 26. The 1×2 arrangement can be utilized as a turn around means in accordance with preprogrammed direction.

Although the aforesaid fluidic transport section is described with reference to a semiconductor wafer transport system the concept is adaptable to other work pieces and although it is common to use air as a fluidic medium to form an air cushion travel and support means such mediums as inert gas and reaction gases are capable of being utilized. The system in which this invention is an integral part is an enclosed controlled environment structure, which environment includes such conditions as temperature, humidity, electrical charges, particles and the like.

Similarly although only several section combinations are illustrated it is possible to adapt a multiplicity of combinations or arrangement of sections dependent upon the overall system concept being used in the transporting of work pieces.

The invention herein disclosed provides a minimum space utilization as such, as well as in a system. Likewise the concept allows distribution of pressurized and filtered controlled environmental fluid. In a total transport system it provides the necessary control points for work piece movement.

Although a preferred embodiment has been described herein it should be obvious to those skilled in the art that the invention may be carried out in various ways and may take various forms of embodiments over those described above. Accordingly, it is understood that the present invention is not limited by the details of the foregoing description but is defined by the following claims.

What is claimed is:

1. An environmentally controlled enclosed modular fluidic multidirectional transport section comprising,
    vacuum means for stopping and substantially centering a work piece at a given position within the section,
    means including a plurality of manifolds arranged for directing the flow of vectorized fluid for maintaining said work piece at said given position, means for detecting the presence of said work piece upon entering into said section in a given direction, and
    means responsive to said detecting means for controlling said vacuum means and said fluid flow through one of said plurality of manifolds of said directing means to move said work piece from said given position of said section in a direction different from said given direction.

2. A fluidic multidirectional transport section in accordance with claim 1 wherein said vacuum means includes a plurality of vacuum ports.

3. A fluidic multidirectional transport section in accordance with claim 2 wherein said vacuum ports are arranged in a configuration such that a first of said ports is situated in a manner within the section to force the work piece to rotate about said first port and come to rest upon said first port and at least one additional port.

4. A fluidic multidirectional transport section in accordance with claim 3 wherein said vacuum ports are situated substantially in three corner quadrants of a square or rectangular shaped section configuration.

5. A fluidic multidirectional transport section in accordance with claim 1 wherein said detecting means includes an optical sensor connected to a logic system whereby vacuum and fluid utilized in the section are preprogram controlled in an off and on mode.

6. Transport apparatus for guiding a moving wafer comprising
    a track,
    vacuum means disposed in said track for stopping said wafer at a given location in said track when said wafer is moving in a first direction,
    means having a plurality of units disposed in said track for directing fluid toward said given location, said units being arranged to maintain said wafer in substantially said given location when all of said units are directing fluid toward said given location, means for detecting the presence of said wafer at said given location, and means responsive to said detecting means for controlling the fluid of one of said units to move said wafer in a second direction from said given location.

7. Transport apparatus as set forth in claim 6 wherein said responsive means further includes means for controlling said vacuum means.

8. Transport apparatus as set forth in claim 6 wherein said vacuum means includes first, second and third ports, said first port being positioned to slow down the movement of said wafer and said second and third ports being positioned with respect to said first port so that at least one of said second and third ports holds said wafer along with said first port in said given location.

9. A transport apparatus as set forth in claim 6 wherein said detecting means includes means for producing signals in response to variations in the intensity of a light beam.

* * * * *